(12) United States Patent
Wu et al.

(10) Patent No.: US 10,770,413 B2
(45) Date of Patent: Sep. 8, 2020

(54) CHIP PACKAGING STRUCTURE AND METHOD, AND ELECTRONIC DEVICE

(71) Applicant: SHENZHEN GOODIX TECHNOLOGY CO., LTD., Shenzhen, Guangdong (CN)

(72) Inventors: Baoquan Wu, Guangdong (CN); Xinfei Yu, Guangdong (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 21 days.

(21) Appl. No.: 16/168,169

(22) Filed: Oct. 23, 2018

(65) Prior Publication Data
US 2019/0081012 A1 Mar. 14, 2019

Related U.S. Application Data

(63) Continuation of application No. PCT/CN2017/101728, filed on Sep. 14, 2017.

(51) Int. Cl.
*H01L 23/495* (2006.01)
*H01L 23/60* (2006.01)
(Continued)

(52) U.S. Cl.
CPC .......... *H01L 23/60* (2013.01); *H01L 23/3107* (2013.01); *H01L 23/4952* (2013.01);
(Continued)

(58) Field of Classification Search
CPC .......... H01L 23/3107; H01L 23/49517; H01L 23/4952; H01L 23/49531; H01L 23/60; H01L 24/48; H01L 24/49; H01L 24/73
See application file for complete search history.

(56) References Cited

U.S. PATENT DOCUMENTS 7,671,459 B2 * 3/2010 Corisis ................. H01L 21/561
257/686
7,898,066 B1 3/2011 Scanlan et al.
(Continued)

FOREIGN PATENT DOCUMENTS

CN 200818445 A 4/2008
CN 102105891 A 6/2011
(Continued)

OTHER PUBLICATIONS

Extended European Search Report for European Application No. 17905903.5 dated Apr. 8, 2019.

*Primary Examiner* — Luan C Thai
(74) *Attorney, Agent, or Firm* — Heslin Rothenberg Farley & Mesiti P.C.

(57) ABSTRACT

A chip packaging structure and method, and an electronic device, are provided. The chip packaging structure includes a support, a chip, at least one conductor, and a package for plastic packaging the support, the chip and the conductor. The chip is arranged on an upper surface of the support, a chip pad is formed on the upper surface of the chip, and the chip pad is connected to an external pad of the support by a bonding wire. The conductor is connected to the external pad or a ground pad of the chip pad, and the shortest distance from the conductor to the upper surface of the package is less than the shortest distance from the bonding wire to the upper surface of the package, whereby chip failure caused by static electricity discharge is greatly reduced.

15 Claims, 6 Drawing Sheets

(51) Int. Cl.
*H01L 23/31* (2006.01)
*H01L 23/00* (2006.01)

(52) U.S. Cl.
CPC .. *H01L 23/49517* (2013.01); *H01L 23/49531* (2013.01); *H01L 24/48* (2013.01); *H01L 24/49* (2013.01); *H01L 24/73* (2013.01); *H01L 23/49513* (2013.01); *H01L 24/32* (2013.01); *H01L 24/45* (2013.01); *H01L 2224/04042* (2013.01); *H01L 2224/2919* (2013.01); *H01L 2224/32225* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48177* (2013.01); *H01L 2224/48227* (2013.01); *H01L 2224/48247* (2013.01); *H01L 2224/49052* (2013.01); *H01L 2224/73265* (2013.01); *H01L 2924/15311* (2013.01); *H01L 2924/15313* (2013.01); *H01L 2924/1815* (2013.01); *H01L 2924/19107* (2013.01)

(56) References Cited

U.S. PATENT DOCUMENTS

| | | | | |
|---|---|---|---|---|
| 8,018,033 B2* | 9/2011 | Moriya | ............... | H01L 24/97 257/659 |
| 8,026,589 B1* | 9/2011 | Kim | ............... | H01L 21/568 257/686 |
| 8,076,770 B2* | 12/2011 | Kagaya | ............... | H01L 23/3128 257/698 |
| 8,120,186 B2* | 2/2012 | Yoon | ............... | H01L 25/105 257/777 |
| 8,373,264 B2* | 2/2013 | Welch | ............... | H01L 21/56 257/692 |
| 8,502,387 B2* | 8/2013 | Choi | ............... | H01L 23/49811 257/774 |
| 8,846,521 B2* | 9/2014 | Sugizaki | ............... | H01L 24/19 438/615 |
| 9,025,301 B1 | 5/2015 | Adlam | | |
| 9,224,717 B2* | 12/2015 | Sato | ............... | H01L 27/14618 |
| 9,736,925 B2* | 8/2017 | Ziglioli | ............... | H05K 1/0237 |
| 2004/0012099 A1* | 1/2004 | Nakayama | ............... | H01L 21/568 257/787 |

FOREIGN PATENT DOCUMENTS

| | | |
|---|---|---|
| CN | 104269393 A | 1/2015 |
| CN | 204167290 U | 2/2015 |
| CN | 205303461 U | 6/2016 |
| CN | 2059933105 U | 1/2017 |
| JP | 6180646 B2 | 6/1994 |

* cited by examiner

CHIP PACKAGING STRUCTURE AND METHOD, AND ELECTRONIC DEVICE

CROSS REFERENCE TO RELATED APPLICATIONS

The present disclosure is a continuation of International Application No. PCT/CN2017/101728 filed on Sep. 14, 2017, which application is hereby incorporated by reference herein, in its entirety.

TECHNICAL FIELD

The present disclosure relates to the field of semiconductor packaging technology and, more particularly, to a chip packaging structure and method, and an electronic device.

BACKGROUND

For an electronic component and IC package, anti-ESD (Electro-Static discharge) breakdown is a very important electrical index. Static electricity is generated from an outside of a chip package, first reaches a surface of the package, and then passes through a plastic package layer of the package to reach a surface of the chip, which may break down a functional circuit of the chip, causing the chip to fail in its function. Since static electricity exists everywhere during production, storage, transportation and use of an electronic chip, functional failures of devices caused by ESD problems take a very large proportion.

The inventors find that at least the following problems exist in the existing technology: in an existing chip package, an anti-ESD breakdown protection circuit or an ESD static electricity path is generally designed inside the chip, so that static electricity that reaches the surface of the chip package can be conducted out of the chip package through the designed path without breaking down the functional circuit of the chip. However, due to diversity of ESD static electricity sources and mode characteristics, static electricity cannot completely follow the designed path to be conducted out of the chip package. If not being conducted out of the chip package, the static electricity may still break down the functional circuit on the surface of the chip.

SUMMARY

Some embodiments of the present disclosure is to provide a chip packaging structure and method, and an electronic device, which can greatly reduce chip failure caused by static electricity discharge without substantially increasing a cost of the chip package.

An embodiment of the present disclosure provides a chip packaging structure, including: a support, a chip, at least one conductor, and a package for plastic packaging the support, the chip and the conductor; the chip is arranged on an upper surface of the support, a chip pad is formed on an upper surface of the chip, and the chip pad is connected to an external pad of the support by wire bonding; the conductor is connected to the external pad or a ground pad of the chip pad, and the shortest distance from the conductor to the upper surface of the package is less than the shortest distance from a bonding wire to the upper surface of the package.

An embodiment of the present disclosure further provides an electronic device including at least one chip packaging structure abovementioned.

An embodiment of the present disclosure further provides a chip packaging method including: disposing a chip on an upper surface of a support, and connecting a chip pad at an upper surface of the chip to an external pad of the support body by wire bonding; connecting at least one conductor to an external pad or a ground pad of the chip pad, and a maximum distance between the conductor and the support being greater than a maximum distance between the bonding wire and the support; packaging the support, the chip and the conductor to form the package; the shortest distance from the conductor to the upper surface of the package is less than the shortest distance from the bonding wire to the upper surface of the package.

Compared with the existing technology, in the present embodiment, the conductor is disposed within the package to connect the external pad of the support or the ground pad of the chip pad, and the shortest distance from the conductor to the upper surface of the package is less than the shortest distance from the bonding wire to the upper surface of the package; that is, the conductor, compared with the chip and bonding wire, is closer to the upper surface of the package, so that the static electricity contacts the conductor first after reaching the upper surface of the package and enters into the package, and conducts the chip packaging structure out of the external pad or ground pad through the conductor, This greatly reduces a chip failure caused by the static electricity discharge without substantially increasing the cost of the chip package.

In addition, a first end of the conductor is connected to the external pad or the ground pad in the chip pad, and a second end of the conductor is exposed on the upper surface of the package. In this embodiment, the second end of the conductor is arranged to be exposed on the upper surface of the package, so that when the static electricity reaches the upper surface of the package (not yet entering the package), the static electricity may quickly enter the conductor from the second end of the conductor, so that the static electricity can be conducted out.

In addition, the conductor is a metal wire, and the first end of the metal wire is connected to the external pad or the ground pad in the chip pad, and the second end of the metal wire is connected to the external pad. This embodiment provides a specific arrangement when the conductor is a metal wire.

In addition, the first end of the metal wire is connected to the external pad, and a part of the metal wire is projected on the upper surface of the chip. In this embodiment, both the first end and the second end of the metal wire are connected to the external pad, and the metal wire arches across the upper surface of the chip, such arrangement of the metal wire may further reduce a probability that static electricity reaches the upper surface of the chip to damage the chip.

In addition, the metal wire is tangent to the upper surface of the package. This embodiment provides another specific arrangement of the metal wire. The metal wire is tangent to the upper surface of the package, that is, the distance between the metal wire and the upper surface of the package is short, so that when the static electricity reaches the upper surface of the package and enters the package, the static electricity may quickly enter the metal wire at the tangent point where the metal wire is tangent to the upper surface of the package so as to be conducted out.

In addition, the metal wire has a diameter greater than or equal to 0.5 mil.

In addition, a difference between the shortest distance from the bonding wire to the package and the shortest distance from the conductor to the upper surface of the package is greater than or equal to 10 μm, so as to conduct out static electricity better.

In addition, a conductor is a metal wire or a metal block.

BRIEF DESCRIPTION OF THE DRAWINGS

One or more embodiments are exemplarily described with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

In order to make objects, technical solutions and advantages of the present disclosure clearer, some embodiments of the present disclosure will be further described in detail below with reference to the accompanying drawings and embodiments. It shall be appreciated that the specific embodiments described here are merely an illustration of the present disclosure but do not intend to limit the present disclosure.

A first embodiment of the present disclosure relates to a chip packaging structure, which is applied to an electronic device, such as a mobile phone, a tablet computer, and the like. A chip may be packaged in a form of QFN (Quad Flat No-lead Package), QFP (Plastic Quad Flat Package), LGA (Land Grid Array), BGA (Ball Grid Array), and the like. But this embodiment is not limited thereto.

In this embodiment, the chip packaging structure includes: a support, a chip, at least one conductor, and a package for plastic packaging the support, the chip and the conductor. The chip is disposed on an upper surface of the support, a chip pad is formed on an upper surface of the chip, and the chip pad is connected to an external pad of the support by wire bonding. The conductor is connected to the external pad or a ground pad of the chip pad, and the shortest distance between the conductor and the upper surface of the package is less than the shortest distance between a bonding wire and the upper surface of the package.

Compared with the existing technology, the conductor connected to the external pad or the ground pad of the chip pad is arranged in the package, and the shortest distance from the conductor to the upper surface of the package is less than the shortest distance from the bonding wire to the upper surface of the package. That is, the conductor is closer to the upper surface of the package as compared to the chip and the wire, so that static electricity contacts the conductor first after the static electricity reaches the upper surface of the package and enters the package, passes through the conductor and is conducted out of the chip packaging structure from the external pad or ground pad, which greatly reduces a problem of chip failure caused by static electricity discharge without substantially increasing the cost of the chip packaging. A particular description is to be presented below on an implementation detail of the chip packaging structure of this embodiment. The following content is only an implementation detail provided to facilitate understanding, and is not indispensable for implementing the present solution.

In the present embodiment, the conductor is a metal wire for illustration. The metal wire may have a diameter greater than or equal to 0.5 mil. The metal wire may be a gold wire, a copper wire, an aluminum wire or a silver wire, and the like. However, the present embodiment does not limit the type or diameter of the metal wire.

Figure 1:
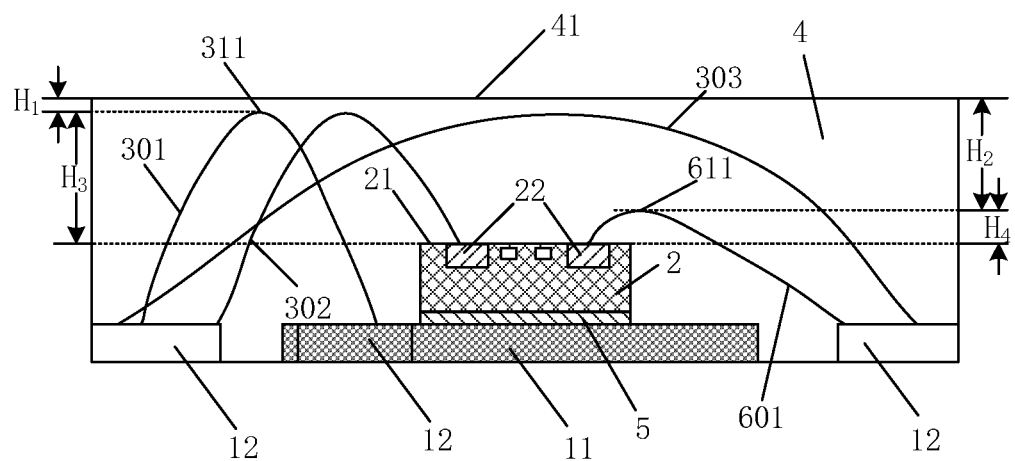
FIG. 1 is a cross-sectional view of a chip packaging structure in accordance with a first embodiment of the present disclosure.
Figure 2:
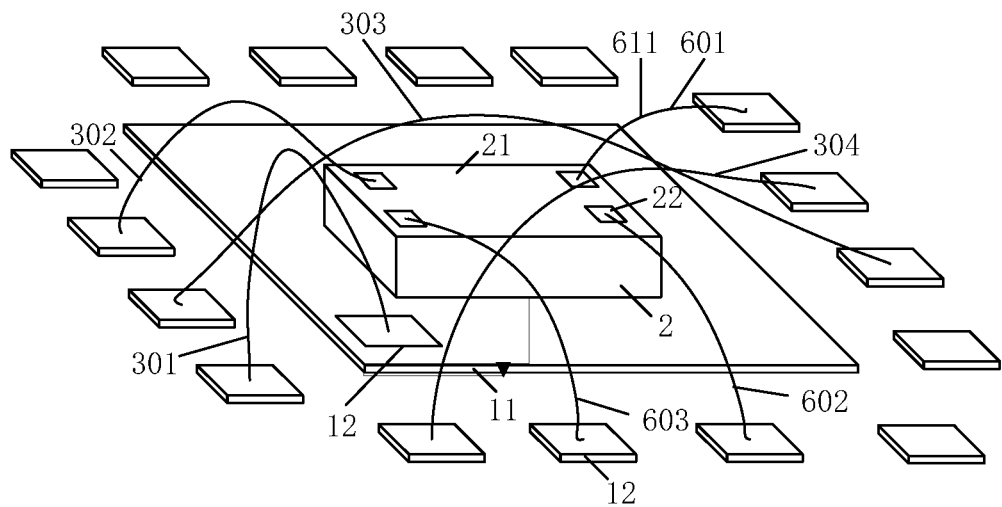
FIG. 2 is a perspective view of a chip packaging structure in accordance with the first embodiment of the present disclosure.

With reference to FIGS. 1 and 2, the chip packaging structure includes a support, a chip 2, at least one conductor, and a package 4. A metal wire 301, a metal wire 302, a metal wire 303, and a metal wire 304 in the figures are all conductors.

The package 4 is used to plastic package the support, the chip 2 and the conductor. The package 4 may be composed of EMC (Epoxy Molding Compound), which is not limited in this embodiment.

With reference to FIG. 1, the support may be a lead wire frame, a substrate, a metal frame or a non-metal frame. The support being a lead frame is taken as an example in FIG. 1. The support includes a frame body 11 and a plurality of external pads 12 around the frame body 11. The external pads 12 are external pins of the chip packaging structure. But a position relationship between the external pad 12 and the frame body 11 is not limited thereto, and the frame body 11 is also provided with a plurality of external pads 12. The frame body 11 and the external pad 12 may be made of same electric material, which is not limited thereto. The frame body 11 and the external pad 12 may be made of different electric materials as well.

It shall be noted that in the present embodiment and the following embodiments, the support being the lead frame is taken as an example. However, the specific type of the support is not limited in this embodiment.

The chip 2 is arranged on the upper surface of the support, specifically, the chip 2 is fixed to the frame body 11 through an adhesive layer 5. A plurality of chip pads 22 are formed on an upper surface 21 of the chip 2, and the chip pad 22 is a functional pin or a ground pin of the chip 2 and connected to the external pad 12 of the support by the bonding wire, so that the chip may communicate with the outside. One end of the bonding wire is connected to the chip pad 22 on the upper surface 21 of the chip 2, and therefore, the highest point of an arc of the bonding wire is higher than the upper surface 21 of the chip 2. A ground pad of the chip pad 22 is the ground pin of the chip. With reference to FIG. 2, it is illustrated that three bonding wires are respectively an electric bonding wire 601, an electric bonding wire 602, and an electric bonding wire 603. The chip pad 22 is connected to the external pad 12 of the support through each electric bonding wire. The highest point of the arc of each electric bonding wire is higher than the upper surface 21 of the chip 2, and taking the electric bonding wire 601 as an example, a highest point 611 of the arc is higher than the upper surface 21 of the chip 2.

In this embodiment, the shortest distance from the conductor to the upper surface 41 of the package 4 is the distance from the highest point of the arc of the metal wire to the upper surface 41 of the package 4. The shortest distance from the bonding wire to the upper surface 41 of the package 4 is the distance from the highest point of the arc of the bonding wire to the upper surface 41 of the package 4. The distance from the highest point of the arc of the metal wire to the upper surface 41 of the package 4 is less than the distance from the highest point of the arc of the boding wire to the upper surface 41 of the package 4. That is, the maximum distance between the metal wire and the plane where the upper surface 21 of the chip 2 locates is greater than the maximum distance between the bonding wire and the plane where the upper surface 21 of the chip 2 locates, so that after the static electricity reaches the upper surface 41 of the package 4 and enters the package 4, the static electricity first contacts the metal wire, then passes through the metal wire and is conducted out of the chip packaging structure from the external pad 12 or the ground pad. With reference to FIG. 1, the distance from the highest point of any metal wire arc to the upper surface 41 is less than the distance from the highest point 611 of the arc of the electric bonding wire 601 to the upper surface 41. Taking the metal wire 301 as an example, a distance $H_1$ from a highest point 311 of the arc of the metal wire 301 to the upper surface 41 is less than a distance $H_2$ from the highest point 611 of the arc of the electric bonding wire 601 to the upper surface 41. That is, a distance $H_3$ between the highest point 311 of the arc of the metal wire 301 and the plane where the upper surface 21 of the chip 2 locates is greater than a distance $H_4$ between the highest point 611 of the arc of the electric bonding wire 601 and the plane where the upper surface 21 of the chip 2 locates.

Preferably, the difference between the distance from the highest point of the arc of the bonding wire to the upper surface 41 of the package 4 and the distance from the highest point of the arc of the metal wire to the upper surface 41 of the package 4 is greater than or equal to 10 μm, that is, the difference between the distance $H_2$ from the highest point 611 of the arc of the electric bonding wire 601 to the upper surface 41 and the distance $H_1$ from the highest point 311 of the arc of the metal line 301 to the upper surface 41 is greater than or equal to 10 μm, i.e., $H_2-H_1 \geq 10$ μm, so as to conduct out static electricity better.

In this embodiment, a first end of the metal wire is connected to the external pad 12 or the ground pad of chip pad 22, and a second end of the metal wire is connected to the external pad 12. That is, the metal wire is connected between any two external pads 12 or between the chip pad 22 and the external pad 12, and the connected chip pad 22 is a ground pad when the metal wire is connected to the chip pad 22. With reference to FIG. 1, taking the metal wire 302 as an example, the metal wire 302 connects the external pad 12 with the ground pad of the chip 2.

Preferably, with reference to FIG. 2, when the metal wire is connected between any two external pads 12, the metal wire is arranged to arch across the upper surface 21 of the chip 2. It is shown in the figure that both the metal wire 303 and the metal wire 304 arch across the upper surface 21 of the chip 2, but a difference lies in that the positions and lengths of projections of the two on the upper surface 21 of the chip 2 are different, i.e., a projection of the metal wire 303 is longer and extends from one side to the opposite side; a projection of the metal wire 304 is shorter and locates at a corner of the upper surface 21 of the chip 2. When the metal wire arches across the upper surface 21 of the chip 2, the highest point of the metal wire locates within the region directly above the upper surface 21 of the chip 2, or is closer to the region directly above the upper surface 21 of the chip 2 as compared with a metal wire (e.g., metal wire 301) that does not arch across the upper surface 21 of the chip 2. For example, the highest point of the metal line 303 locates directly above the upper surface 21 of the chip 2; the highest point of the metal wire 301 and the highest point of the metal wire 304 are both outside the region directly above the upper surface 21 of the chip 2, but the highest point of the metal wire 304 is closer to the region directly above the upper surface 21 of the chip 2 than the highest point of the metal wire 301 is. When static electricity enters the package 4 from the region directly above the upper surface 21 of the chip 2 (i.e., the region of the upper surface 41 of the package 4 corresponding to the upper surface 21 of the chip 2), the path through which the static electricity reaches the highest point of the metal wire (for example, the metal wire 303 and the metal wire 304) that arches across the upper surface 21 of the chip 2 is shorter as compared with the path through which the static electricity reaches the highest point of the metal wire (for example, the metal wire 301) that does not arch across the upper surface 21 of the chip 2, so as to conduct static electricity more quickly and more effectively, and reduce the probability that the static electricity reaches the upper surface 21 of the chip 2 to damage the chip 2 (that is, the longer the path of static electricity reaching the highest point of the metal wire, the greater the probability of occurrence of error).

It shall be noted that FIG. 2 only schematically illustrates the position where the metal wire (the metal wire 303 and the metal wire 304) arches across the upper surface 21 of the chip 2, but this embodiment does not limit thereto.

It shall be noted that the figures in the embodiments only schematically present the number of the conductors (metal wires), but this embodiment is not limited thereto.

A second embodiment of the present disclosure provides a chip packaging structure, which is a development on the basis of the first embodiment. The main development is that the second end of the conductor (metal wire) is exposed on the upper surface 41 of the package 4, with reference to FIG. 3.

Figure 3:
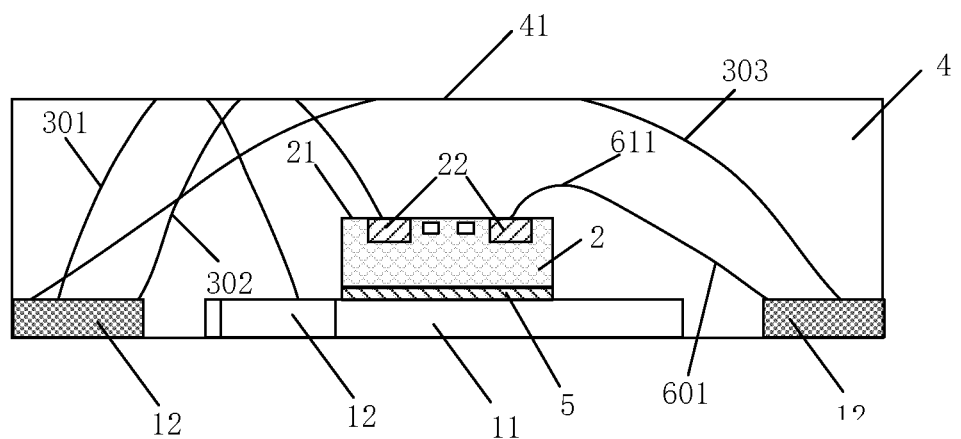
FIG. 3 is a cross-sectional view of a chip packaging structure in accordance with a second embodiment of the present disclosure.

In this embodiment, the first end of the metal wire is connected to the external pad 12 or the ground pad of the chip pad 22, the second end of the metal wire is exposed on the upper surface 41 of the package 4, and the distance from the highest point of the arc of the metal wire to the upper surface 41 of the package 4 is zero, which is less than the distance from the highest point of the arc of the bonding wire to the upper surface 41 of the package 4. With reference to FIG. 3, the upper surface 41 of the package 4 is polished on the basis of the chip packaging structure in FIG. 1, so that the metal wire 301, the metal wire 302, and the metal wire 303 are polished to be broken and exposed on the upper surface 41 of the package 4.

In this embodiment, compared with the first embodiment, the second end of the metal wire is exposed on the upper surface of the package, so that when the static electricity reaches the upper surface of the package (not yet entering the package), it may quickly enter the metal wire through the second end of the metal wire, and is then conducted out of the chip packaging structure through the external pad or the ground pad connected with the metal wire.

A third embodiment of the present disclosure provides a chip packaging structure. This embodiment is a development on the basis of the first embodiment. A main development is, with reference to FIG. 4, a conductor (metal wire) is tangent to the upper surface of the package.

Figure 4:
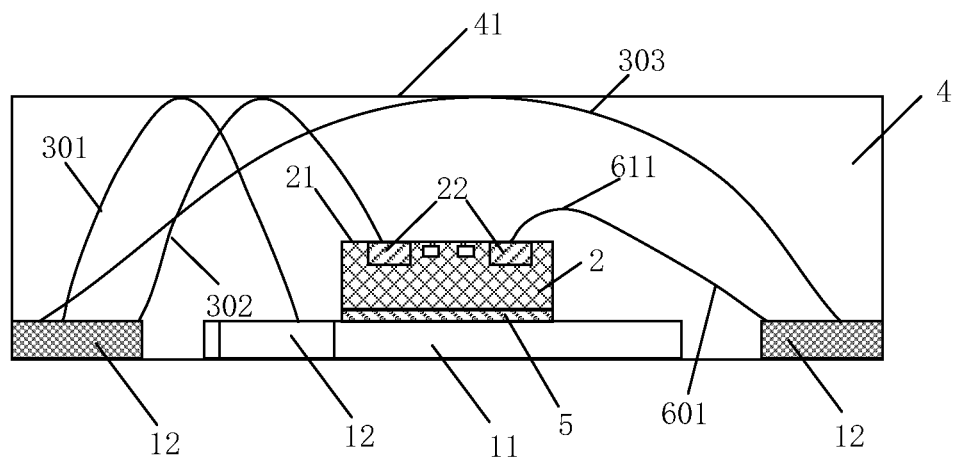
FIG. 4 is a cross-sectional view of a chip packaging structure in accordance with a third embodiment of the present disclosure.

In this embodiment, the closer the highest point of the arc of the metal wire is to the upper surface 41 of the package 4, the better the effect of conducting out static electricity. Preferably, the metal wire is arranged to be tangent to the upper surface 41 of the package 4. The distance from the highest point of the arc of the metal wire to the upper surface 41 of the package 4 is now approximately zero, which is less than the distance from the highest point of the arc of the bonding wire to the upper surface 41 of the package 4. With reference to FIG. 4, the metal wire 301, the metal wire 302, and the metal wire 303 are all tangent to the upper surface 41 of the package 4. However, it is not limited thereto, and a case may be that some of the metal wires are tangent to the upper surface 41 of the package 4, and this embodiment is limited thereto.

Compared with the first embodiment, this embodiment provides another specific arrangement of the metal wire. The metal wire is tangent to the upper surface of the package, that is, the distance between the metal wire and the upper surface of the package is small. Therefore, once the static electricity reaches the upper surface of the package and enters the package, the static electricity quickly enters the metal wire at the tangent position with respect to the upper surface of the package, so as to be conducted out.

A fourth embodiment of the present disclosure provides a chip packaging structure. The present embodiment is substantially the same as the first embodiment. A main difference is that, in this embodiment, the conductor is a metal block, with reference to FIG. 5A and FIG. 5B.

When the conductor is a metal block, the metal block may be connected to the external pad of the support or the ground pad of the chip pad, which, specifically, is as follows.

Figure 5A:
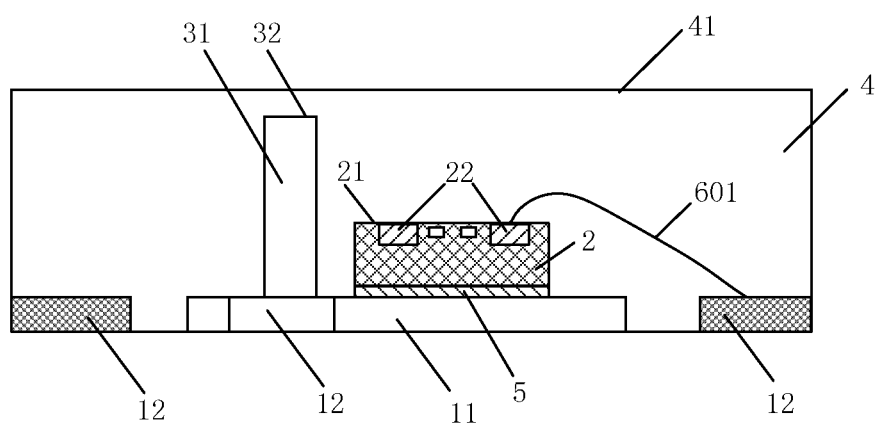
FIG. 5A is a cross-sectional view showing a chip packaging structure in which a metal block is connected to an external pad according to a fourth embodiment of the present disclosure.

Example one. The metal block is connected to the external pad of the support. With reference to FIG. 5A, the metal block 31 is arranged on the upper surface of the support. Specifically, the metal block 31 is arranged on the frame body 11 of the support (that the support is a lead frame is taken as an example, but is not limited thereto). The metal block 31 is connected to the external pad of the support, that is, to any external pad 12 of the frame body 11 to discharge the static electricity to the outside of the chip packaging structure. It shall be noted that, in the figure, as an example, the metal block 31 is connected to the external pad 12 of the frame body 11, which is not limited thereto, but the metal block 31 may be connected to any external pad of the support, but this embodiment is not limited thereto.

Figure 5B:
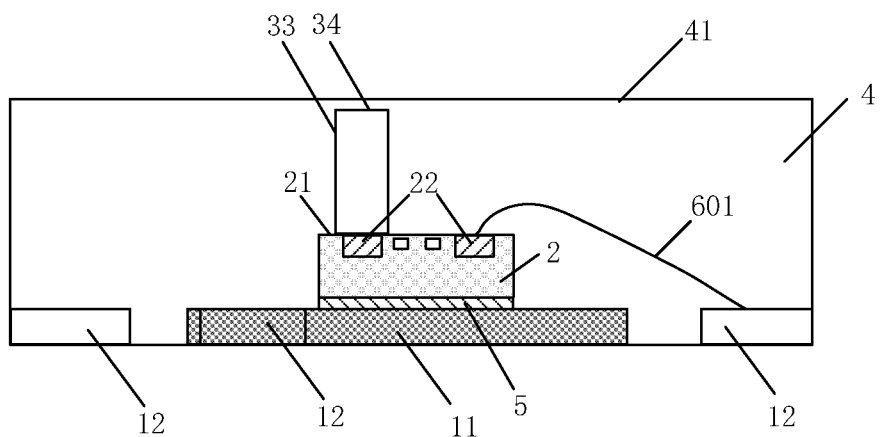
FIG. 5B is a cross-sectional view showing a chip packaging structure in which a metal block is connected to a ground pad according to a fourth embodiment of the present disclosure.

Example two. The metal block is connected to the ground pad of the chip pad. With reference to FIG. 5B, the metal block 33 is arranged on the upper surface 21 of the chip 2, and the connected chip pad 22 is a ground pad so that static electricity may be conducted out of the chip packaging structure.

In the present embodiment, the shortest distance from the conductor to the upper surface 41 of the package 4 is the distance from the upper surface of the metal block to the upper surface 41 of the package 4, the shortest distance from the bonding wire to the upper surface 41 of the package 4 is the distance from the highest point of the arc of the bonding wire to the upper surface 41 of the package 4, and the distance from the upper surface of the metal block to the upper surface 41 of the package 4 is less than the distance from the highest point of the arc of the bonding wire to the upper surface 41 of the package 4. That is, the distance from the upper surface of the metal block to the plane where the upper surface 21 of the chip 2 locates is greater than the distance from the highest point of the arc of the bonding wire to the plane where the upper surface 21 of the chip 2 locates. Take the chip packaging structure in FIG. 5A as an example. The distance from an upper surface 32 of the metal block 31 to the upper surface 41 of the package 4 is less than the distance from the highest point 611 of the arc of the electric bonding wire 601 to the upper surface 41, and the distance from the upper surface 32 of the metal block 31 to the plane where the upper surface 21 of the chip 2 locates is greater than the distance from the highest point 611 of the arc of the electric bonding wire 601 to the plane where the upper surface 21 of the chip 2 locates.

Preferably, the difference between the distance from the highest point of the arc of the bonding wire to the upper surface 41 of the package 4 and the distance from the upper surface of the metal block to the upper surface 41 of the package 4 is greater than or equal to 10 μm. Take the chip packaging structure in FIG. 5A as an example. The difference between the distance from the highest point 611 of the arc of the electric bonding wire 601 to the upper surface 41 and the distance from the upper surface 32 of the metal block 31 to the upper surface 41 of the package 4 is greater than or equal to 10 μm, so as to conduct out static electricity better.

It shall be noted that, FIG. 5A and FIG. 5B only schematically illustrate the shape, the number, and the position of the metal block, but the present embodiment is not limited thereto.

Figure 6:
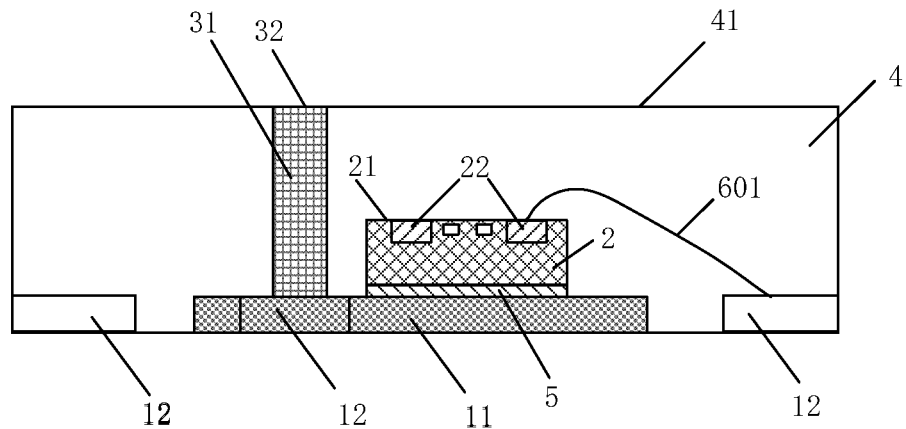
FIG. 6 is a cross-sectional view of a chip packaging structure in accordance with a fifth embodiment of the present disclosure.

A fifth embodiment of the present disclosure provides a chip packaging structure, which is a development on the basis of the fourth embodiment, and the main development lies in, with reference to FIG. 6, the second end of the conductor (metal block) is exposed on the upper surface of the package.

In this embodiment, the closer the upper surface of the metal block is to the upper surface 41 of the package 4, the better the effect of conducting out the static. Preferably, the first end of the metal block is connected to the external pad 12, and the second end of the metal block is exposed on the upper surface 41 of the package 4. With reference to FIG. 6, the upper surface 41 of the package 4 is polished on the basis of the chip packaging structure in FIG. 5A (the chip packaging structure in FIG. 5A is taken as an example, but the present disclosure is not limited thereto), so that the upper surface 32 of the metal block 31 is in a same plane as the upper surface 41 of the package 4 is. When static electricity reaches the upper surface 41 of the package 4 (not yet entering the package), the static electricity may quickly enter the metal block 31 from the upper surface 32 of the metal block 31, and is then conducted out of the chip packaging structure from the external pad 12 connected to the metal block 31.

In this embodiment, compared with the fourth embodiment, the second end of the metal block is exposed on the upper surface of the package so that when static electricity reaches the upper surface of the package (not yet entering the plastic body), the static electricity may quickly enter the metal block from the second end of the metal block and is conducted out of the chip packaging structure from the external pad connected with the metal block.

A sixth embodiment of the present disclosure provides an electronic device, such as a mobile phone, a tablet computer, and the like. The electronic device includes at least one chip packaging structure as described in any of the first to fifth embodiments.

Compared with the existing technology, in this embodiment, the conductor is arranged in the package and is connected to the external pad of the support or the ground pad of the chip pad, and the shortest distance from the conductor to the upper surface of the package is less than the shortest distance from the bonding wire to the upper surface of the package; that is, compared with the chip and the bonding wire, the conductor is closer to the upper surface of the package, so that when static electricity reaches the upper surface of the package and enters the package, the static electricity contacts the conductor first, passes through the conductor and then is conducted out of the chip packaging structure from the external pad or the ground pad, which greatly reduces a problem of chip failure caused by static electricity discharge without substantially increasing the cost of the chip package.

A seventh embodiment of the present disclosure provides a chip packaging method, which is applied to packaging a chip. The chip may be packaged in a form of QFN (Quad Flat No-lead Package), QFP (Plastic Quad Flat Package), LGA (Land Grid Array), BGA (Ball Grid Array), and the like, but this embodiment is not limited thereto.

Figure 7:
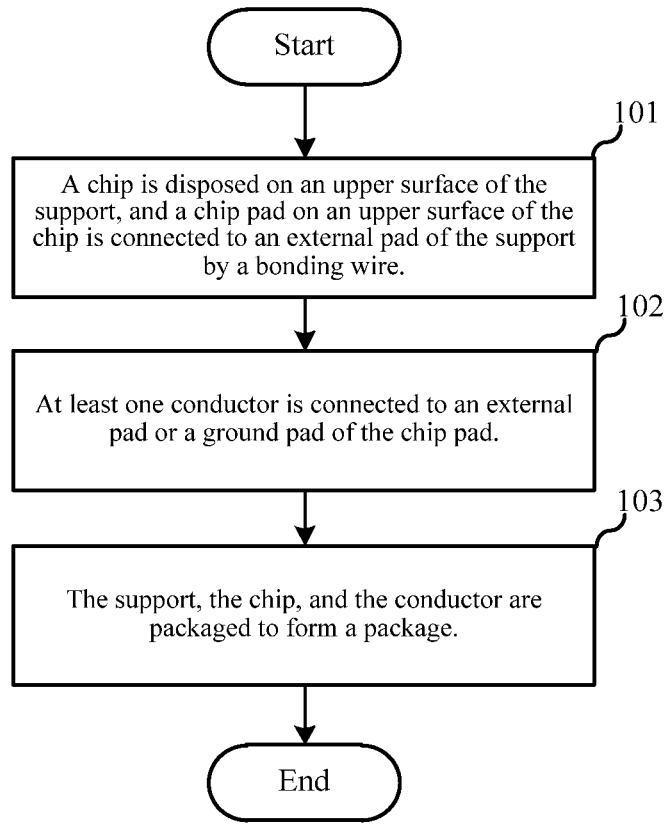
FIG. 7 is a particular flowchart of a chip packaging method in accordance with a sixth embodiment of the present disclosure.

A particular flowchart of a chip packaging method in accordance with the present embodiment is shown in FIG. 7.

In step 101, a chip is disposed on an upper surface of the support, and a chip pad on an upper surface of the chip is connected to an external pad of the support by a bonding wire.

Specifically, the chip is bonded to the upper surface of the support by an adhesive. With reference to FIG. 1, as an example, the support is a lead frame. The lead frame includes a frame body 11 and a plurality of external pads 12. The frame body 11 is also provided with a plurality of external pads 12, a chip 2 is fixed to the frame body 11 by an adhesive layer 5, and a chip pad 22 on the upper surface 21 of the chip 2 is connected to the external pad 12 of the support by a bonding wire. Accordingly, the highest point of the arc of the bonding wire is higher than the plane where the upper surface 21 of the chip 2 locates, that is, the highest point 611 of the arc of the electric bonding wire 601 is higher than the plane where the upper surface 21 of the chip 2 locates.

In step 102, at least one conductor is connected to an external pad or a ground pad of the chip pad.

Specifically, the conductor may be a metal wire or a metal block. In welding, the maximum distance between the conductor and the support shall be made greater than the maximum distance between the bonding wire and the support, i.e., to make the maximum distance from the conductor to the plane where the upper surface of the chip locates greater than the maximum distance from the highest point of the arc of the bonding wire to the plane where the upper surface of the chip locates.

When the conductor is a metal wire, a first end of the metal wire is connected to the external pad or the ground pad of the chip pad, and a second end of the metal wire is connected to the external pad. The shortest distance from the conductor to the upper surface 41 of the package 4 is the distance from the highest point of the arc of the metal wire to the upper surface 41 of the package 4, the shortest distance from the bonding wire to the upper surface 41 of the package 4 is the distance from the highest point of the arc of the bonding wire to the upper surface 41 of the package 4, and the distance from the highest point of the arc of the metal wire to the upper surface 41 of the package 4 is less than the distance from the highest point of the arc of the bonding wire to the upper surface 41 of the package 4. That is, the maximum distance from the conductor to the upper surface 21 of the chip 2 is greater than the maximum distance from the bonding wire to the upper surface 21 of the chip 2. With reference to FIG. 1, take the metal wire 301 as an example. The distance from the highest point 311 of the arc of the metal wire 301 to the frame body 11 is greater than the distance from the highest point 611 of the arc of the electric bonding wire 601 to the frame body 11; that is, the distance from the highest point 311 of the arc of the metal wire 301 to the plane where the upper surface 21 of the chip 2 locates is greater than the distance from the highest point 611 of the arc of the electric bonding wire 601 to the plane where the upper surface 21 of the chip 2 locates. The diameter of the metal wire may be greater than or equal to 0.5 mil.

When the conductor is a metal block, the metal block is connected to the external pad of the support or the ground pad of the chip pad. Take the chip packaging structure of FIG. 5A as an example (the present disclosure is not limited thereto), the metal block is connected to the external pad of the support. The shortest distance from the conductor to the upper surface 41 of the package 4 is the distance from the upper surface 32 of the metal block 31 to the upper surface 41 of the package 4, the shortest distance from the bonding wire to the upper surface 41 of the package 4 is the distance from the highest point of the arc of the bonding wire to the upper surface 41 of the package 4, and the distance from the upper surface 32 of the metal block 31 to the upper surface 41 of the package 4 is less than the distance from the highest point of the arc of the bonding wire to the upper surface 41 of the package 4. That is, the distance from the upper surface 32 of the metal block 31 to the plane where the upper surface 21 of the chip 2 locates is greater than the distance from the highest point of the arc of the bonding wire to the plane where the upper surface 21 of the chip 2 locates. With reference to FIG. 5A, the distance from the upper surface 32 of the metal block 31 to the frame body 11 is greater than the distance from the highest point 611 of the arc of the electric bonding wire 601 to the frame body 11, that is, the distance from the upper surface 32 of the metal block 31 to the plane where the upper surface 21 of the chip 2 locates is greater than the distance from the highest point 611 of the arc of the electric bonding wire 601 to the plane where the upper surface 21 of the chip 2 locates.

In step 103, the support, the chip, and the conductor are packaged to form a package.

Specifically, after step 101 and step 102, the support is placed in a mold, and is injected with plastic sealant to form the package after the plastic sealant is cured. FIG. 1 shows a specific structure of the package. During the welding in step 102, the maximum distance between the conductor and the support is greater than the maximum distance between the bonding wire and the support, and thus, in the package finally formed, the shortest distance from the conductor to the upper surface of the package is shorter than the shortest distance from the bonding wire to the upper surface of the package. Preferably, during the welding in step 102, the difference between the maximum distance from the conductor to the support and the maximum distance from the bonding wire to the support is made greater than or equal to 10 so that in the package, the difference between the shortest distance from the bonding wire to the upper surface 41 of the package 4 and the shortest distance from the conductor to the upper surface 41 of the package 4 is greater than or equal to 10 so as to conduct out static electricity better.

Since the first embodiment and the fourth embodiment correspond to the present embodiment, the present embodiment may be implemented in cooperation with the first embodiment and the fourth embodiment. The related technical details mentioned in the first embodiment and the fourth embodiment are effective in this embodiment, and the technical effects that may be achieved in the first embodiment and the fourth embodiment may also be implemented in this embodiment, and these will not be repeated here in order to reduce repetition. Correspondingly, the related technical details mentioned in this embodiment may also be applied to the first embodiment and the fourth embodiment.

In this embodiment, the conductors added to the existing technology are metal wires or metal blocks, which are all existing materials and do not affect the packaging process. Therefore, an actual added cost is only less than one percent, which has good economic benefit.

In this embodiment, compared with the existing technology, the conductor is arranged in the package and is connected to the external pad of the support or the ground pad of the chip pad, and the shortest distance from the conductor to the upper surface of the package is less than the shortest distance from the bonding wire to the upper surface of the package; that is, compared with the chip and bonding wire, the conductor is closer to the upper surface of the package, so that after the static electricity reaches the upper surface of the plastic body and enters the package, the static electricity contacts the conductor first, and then passes through the conductor and is conducted out of the chip packaging structure from the external pad or the ground pad, which greatly reduces chip failure caused by static electricity discharge without substantially increasing the cost of the chip packaging.

An eighth embodiment of the present disclosure provides a chip packaging method, which is a development on the basis of the seventh embodiment. The main development is that in this embodiment, after a package is formed, the upper surface of the package is processed so that the second end of the conductor is exposed on the upper surface of the package.

Figure 8:
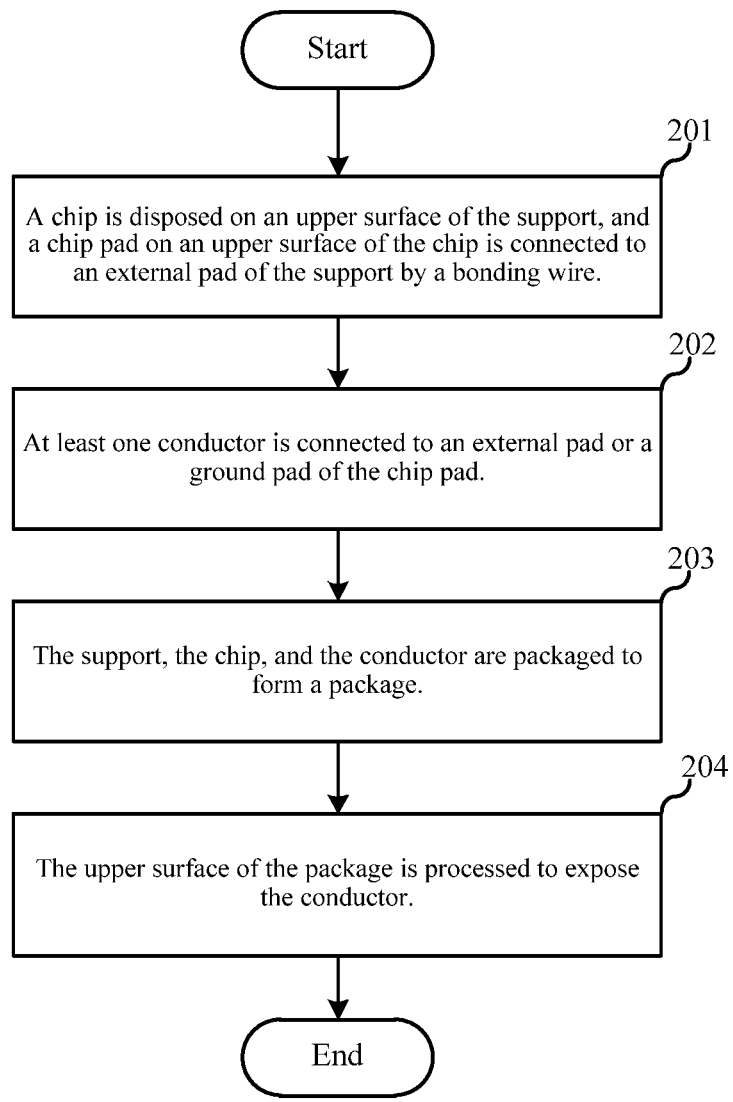
FIG. 8 is a particular flowchart of a chip packaging method in accordance with a seventh embodiment of the present disclosure.

A particular flowchart of the chip packaging method in accordance with the present embodiment is shown in FIG. 8.

Steps 201 to 203 are almost the same as steps 101 to 103, except that an additional step 204 is added in the present embodiment, which is particularly as follows.

In step 204, the upper surface of the package is processed to expose the conductor.

Specifically, after the package is formed, the upper surface of the package is appropriately polished so that the second end of the conductor is exposed on the upper surface of the package.

With reference to FIG. 3, the conductor is a metal wire which is formed on the basis of the chip packaging structure shown in FIG. 1, in which the metal wire 301, the metal wire 302, and the metal wire 303 are polished to be broken and exposed on the upper surface 41 of the package 4.

With reference to FIG. 6, the conductor is a metal block. On the basis of the chip packaging structure of FIG. 5A, the upper surface 41 of the package 4 is polished (the chip packaging structure of FIG. 5A is taken as an example, but the present disclosure is not limited thereto), so that the upper surface 32 of the metal block 31 and the upper surface 41 of the package 4 are in a same plane, but the present disclosure is not limited thereto. Alternatively, in the step 102 (i.e., step 202 in the present embodiment) that the at least one conductor is connected to the external pad or the ground pad of the chip pad, the upper surface of the metal block 31 may be directly in the same plane as the upper surface 41 of the package 4, but this embodiment is not limited thereto.

Since the second embodiment and the fifth embodiment correspond to the present embodiment, the present embodiment may be implemented in cooperation with the second embodiment and the fifth embodiment. The related technical details mentioned in the second embodiment and the fifth embodiment are effective in this embodiment, and the technical effects that may be achieved in the second embodiment and the fifth embodiment may also be implemented in this embodiment, and these will not be repeated here in order to reduce repetition. Correspondingly, the related technical details mentioned in this embodiment may also be applied to the second embodiment and the fifth embodiment.

In this embodiment, compared with the seventh embodiment, the second end of the conductor is exposed on the upper surface of the package so that when static electricity reaches the upper surface of the package (not yet entering the package), the static electricity may quickly enter the conductor from the second end of the conductor so as to be conducted out.

A ninth embodiment of the present disclosure relates to a chip packaging method, which is a development on the basis of the seventh embodiment. The development mainly lies in, when the conductor is a metal wire, the metal wire is tangent to the upper surface of the package in the packaging process.

Figure 9:
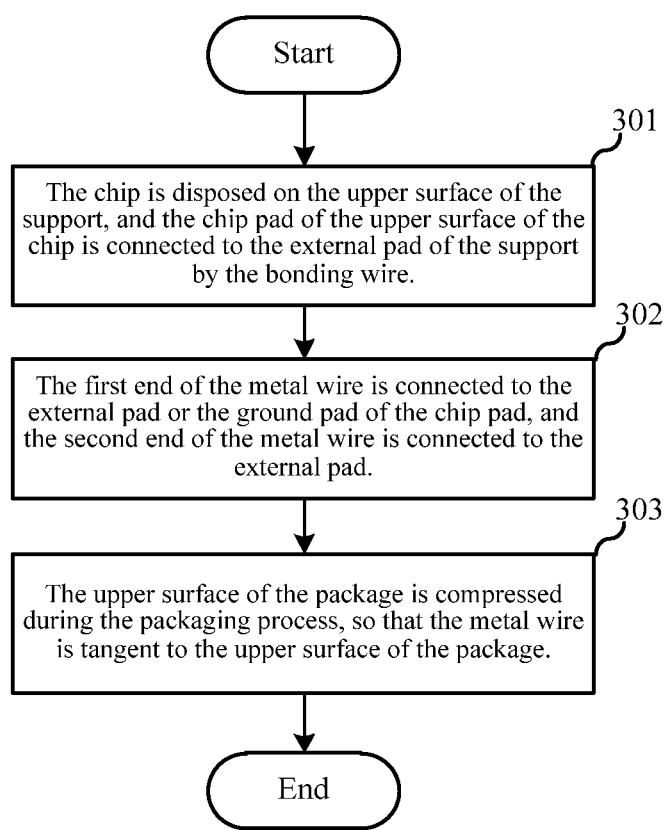
FIG. 9 is a particular flowchart of a chip packaging method in accordance with an eighth embodiment of the present disclosure.

A particular flowchart of the chip packaging method in accordance with the present embodiment is shown in FIG. 9.

In step 301, the chip is disposed on the upper surface of the support, and the chip pad of the upper surface of the chip is connected to the external pad of the support by the bonding wire.

Specifically, the step 301 is approximately the same as the step 101 in the seventh embodiment and thus is not repeated herein.

In step 302, the first end of the metal wire is connected to the external pad or the ground pad of the chip pad, and the second end of the metal wire is connected to the external pad.

Specifically, with reference to FIG. 1, the metal wire 302 is taken as an example. The metal wire 302 is connected to the external pad 12 and the ground pad of the chip pad 22. Preferably, with reference to FIG. 2, when the metal wire is connected between any two external pads 12, the metal wire arches across the upper surface 21 of the chip 2. It is shown in the figure that both the metal wire 303 and the metal wire 304 arch across the upper surface 21 of the chip 2, but a difference lies in that the positions and lengths of projections of the two on the upper surface 21 of the chip 2 are different, i.e., a projection region of the metal wire 303 is longer and extends from one side to the opposite side; a projection of the metal wire 304 is shorter and locates at a corner of the upper surface 21 of the chip 2. When the metal wire arches across the upper surface 21 of the chip 2, the highest point of the metal wire locates within the region directly above the upper surface 21 of the chip 2, or is closer to the region directly above the upper surface 21 of the chip 2 as compared with a metal wire (e.g., metal wire 301) that does not arch across the upper surface 21 of the chip 2. For example, the highest point of the metal line 303 locates directly above the upper surface 21 of the chip 2; the highest point of the metal wire 301 and the highest point of the metal wire 304 are both outside the region directly above the upper surface 21 of the chip 2, but the highest point of the metal wire 304 is closer to the region directly above the upper surface 21 of the chip 2 than the highest point of the metal wire 301 is. When static electricity enters the package 4 from the region directly above the upper surface 21 of the chip 2 (i.e., the region of the upper surface 41 of the package 4 corresponding to the upper surface 21 of the chip 2), the path through which the static electricity reaches the highest point of the metal wire that arches across the upper surface 21 of the chip 2 (for example, the metal wire 303 and the metal wire 304) is shorter as compared with the path through which the static electricity reaches the highest point of the metal wire that does not arch across the upper surface 21 of the chip 2 (for example, the metal wire 301), so as to conduct static electricity more quickly and more effectively and reduce the probability that the static electricity reaches the upper surface 21 of the chip 2 to damage the chip 2 (the longer the path of static electricity reaching the highest point of the metal wire is, the greater the probability of occurrence of error is).

In step 303, the upper surface of the package is compressed during the packaging process, so that the metal wire is tangent to the upper surface of the package.

Specifically, after the support is placed in the mold and the plastic sealant is injected, the uncured plastic sealant is compressed by the mold so that the metal wire is tangent to the upper surface of the package. The closer the highest point of the arc of the metal wire is to the upper surface 41 of the package 4, the better the effect of conducting out static electricity is. In the present embodiment, the metal wire is tangent to the upper surface 41 of the package 4. With reference to FIG. 4, the metal wire 301, the metal wire 302, and the metal wire 303 are all tangent to the upper surface 41 of the package 4. However, this embodiment is not limited thereto, but some of the metal wires may be tangent to the upper surface 41 of the package 4. This embodiment is not limited thereto.

Since the third embodiment corresponds to the present embodiment, the present embodiment may be implemented in cooperation with the third embodiment. The related technical details mentioned in the third embodiment are effective in this embodiment, and the technical effects that may be achieved in the third embodiment may also be implemented in this embodiment, and these will not be repeated here in order to reduce repetition. Correspondingly, the related technical details mentioned in this embodiment may also be applied to the third embodiment.

Compared with the seventh embodiment, this embodiment provides another specific arrangement of the metal wire. The metal wire is tangent to the upper surface of the package, that is, the distance between the metal wire and the upper surface of the package is very small. Therefore, once the static electricity reaches the upper surface of the package and enters the package, the static electricity quickly enters the metal wire at the tangent position where the metal wire is tangent to the upper surface of the package, so as to be conducted out.

Those skilled in the art should appreciate that the aforementioned embodiments are specific embodiments for implementing the present invention. In practice, however, many changes can be made in the forms and details of the specific embodiments without departing from the spirit and scope of the invention.

What is claimed is:

1. A chip packaging structure, comprising:
   a support;
   a chip;
   at least one conductor; and
   a package for plastic packaging the support, the chip, and the conductor;
   the chip being disposed on an upper surface of the support, a chip pad being formed on an upper surface of the chip, and the chip pad being connected to an external pad of the support by a bonding wire;
   the conductor being connected to a ground pad of the chip pad, and a shortest distance from the conductor to an upper surface of the package being less than a shortest distance from the bonding wire to the upper surface of the package; and
   the conductor comprising a first end and a second end which are two free ends located oppositely in a length of the conductor, the first end being connected to the ground pad of the chip pad, the second end extending towards the upper surface of the package, and an end surface of the second end being covered with the package.

2. The chip packaging structure according to claim 1, wherein a difference between a shortest distance from the bonding wire to the upper surface of the package and a shortest distance from the conductor to the upper surface of the package is greater than or equal to 10 μm.

3. The chip packaging structure according to claim 1, wherein the conductor comprises a metal block.

4. An electronic device, comprising the chip packaging structure according to claim 1.

5. A chip packaging method, comprising:
   disposing a chip on an upper surface of a support, and connecting a chip pad on an upper surface of the chip to an external pad of the support by a bonding wire;
   connecting at least one conductor to a ground pad of the chip pad, and a maximum distance from the conductor to the support being greater than a maximum distance from the bonding wire to the support;
   packaging the support, the chip and the conductor to form a package;
   wherein a shortest distance from the conductor to the upper surface of the package is less than a shortest distance from the bonding wire to the upper surface of the package; and
   wherein the conductor comprises a first end and a second end which are two free ends located oppositely in a length of the conductor, the first end is connected to the ground pad of the chip pad, the second end extends towards the upper surface of the package, and an end surface of the second end being covered with the package.

6. The chip packaging method according to claim 5, wherein a difference between a shortest distance from the bonding wire to the upper surface of the package and a shortest distance from the conductor to the upper surface of the package is greater than or equal to 10 μm.

7. The chip packaging method according to claim 5, wherein the conductor comprises a metal block.

8. The chip packaging structure according to claim 1, wherein the second end of the conductor is located right above the chip.

9. The chip packaging structure according to claim 5, wherein the second end of the conductor is located right above the chip.

10. A chip packaging structure, comprising:
a support;
a chip;
at least one conductor; and
a package for plastic packaging the support, the chip, and the conductor;
the chip being disposed on an upper surface of the support, a chip pad being formed on an upper surface of the chip, and the chip pad being connected to an external pad of the support by a bonding wire;
the conductor being connected to a ground pad of the chip pad and comprising a crest portion disposed closer to an upper surface of the package than any other portions of the conductor, and the crest portion being covered with the package; and
the distance from the crest portion to the upper surface of the package being less than a shortest distance from the bonding wire to the upper surface of the package.

11. The chip packaging structure according to claim 10, wherein the conductor comprises a metal wire, a first end of the metal wire is connected to the ground pad of the chip pad, and a second end of the metal wire is connected to the external pad.

12. The chip packaging structure according to claim 11, wherein the metal wire has a diameter greater than or equal to 0.5 mil.

13. The chip packaging structure according to claim 10, wherein a difference between a shortest distance from the bonding wire to the upper surface of the package and a shortest distance from the conductor to the upper surface of the package is greater than or equal to 10 μm.

14. The chip packaging structure according to claim 10, wherein the conductor comprises a metal block.

15. The chip packaging structure according to claim 13, wherein the second end of the conductor is located right above the chip.

* * * * *